United States Patent
Tseng et al.

(10) Patent No.: US 7,906,200 B2
(45) Date of Patent: Mar. 15, 2011

(54) COMPOSITE CIRCUIT SUBSTRATE STRUCTURE

(75) Inventors: Tzyy-Jang Tseng, Hsinchu (TW); Chih-Peng Fan, Taoyuan County (TW)

(73) Assignee: Unimicron Technology Corp., Taoyuan (TW)

(*) Notice: Subject to any disclaimer, the term of this patent is extended or adjusted under 35 U.S.C. 154(b) by 0 days.

(21) Appl. No.: 12/424,057

(22) Filed: Apr. 15, 2009

(65) Prior Publication Data
US 2010/0215927 A1   Aug. 26, 2010

(30) Foreign Application Priority Data
Feb. 20, 2009   (TW) ............................... 98105421 A

(51) Int. Cl.
*B32B 9/00* (2006.01)
(52) U.S. Cl. ............ 428/209; 174/96; 174/97; 174/255; 174/261; 257/508
(58) Field of Classification Search .................. 428/209, 428/901; 174/256–258, 255, 261, 96–98; 257/508
See application file for complete search history.

(56) References Cited

U.S. PATENT DOCUMENTS
| | | | | |
|---|---|---|---|---|
| 4,080,513 A * | 3/1978 | Cuneo et al. | .................. | 174/255 |
| 6,528,145 B1 * | 3/2003 | Berger et al. | .................. | 428/156 |
| 6,810,583 B2 * | 11/2004 | Carpenter et al. | .............. | 29/852 |

FOREIGN PATENT DOCUMENTS
| | | |
|---|---|---|
| TW | I288591 | 10/2007 |
| TW | I299646 | 12/2007 |
| TW | 200805611 | 1/2008 |

* cited by examiner

*Primary Examiner* — Cathy Lam
(74) *Attorney, Agent, or Firm* — J.C. Patents

(57) ABSTRACT

A composite circuit substrate structure includes a first dielectric layer, a second dielectric layer, a glass fiber structure, and a patterned circuit. The first dielectric layer has a first surface and a second surface opposite to each other. The second dielectric layer is disposed on the first dielectric layer and entirely connected to the first surface. The glass fiber structure is distributed in the second dielectric layer. The patterned circuit is embedded in the first dielectric layer from the second surface, and the patterned circuit is not contacted with the glass fiber structure.

6 Claims, 2 Drawing Sheets

COMPOSITE CIRCUIT SUBSTRATE STRUCTURE

CROSS-REFERENCE TO RELATED APPLICATION

This application claims the priority benefit of Taiwan application serial no. 98105421, filed on Feb. 20, 2009. The entirety of the above-mentioned patent application is hereby incorporated by reference herein and made a part of specification.

BACKGROUND OF THE INVENTION

1. Field of the Invention

The present application relates to a circuit substrate structure, and more particularly to a composite circuit substrate structure.

2. Description of Related Art

In current semiconductor package technology, a circuit substrate is one of the most frequently used components. The circuit substrate is mainly formed by stacking a patterned circuit and a dielectric layer. The dielectric layer is commonly made of resin. Since structural strength of resin is relatively weak, a glass fiber structure can be distributed in the dielectric layer, so as to increase the structural strength of the dielectric layer.

In a circuit substrate having an embedded patterned circuit, when glass fiber is distributed in a dielectric layer, a patterned circuit is likely to contact the glass fiber structure in the dielectric layer. During an electroplating process, an electroplating solution possibly permeates into a gap between the glass fiber structure and the dielectric layer, and conductive metal is then formed in the gap after the electroplating process is performed. What is described above is called permeating. Two conductive wires in the patterned circuit may be connected through the conductive metal, thus giving rise to short circuit.

In addition, when a voltage is applied or moisture is increased in a reliability test, metal particles in the two conductive wires having a relatively small pitch therebetween move to the gap between the glass fiber structure and the dielectric layer due to electron mobility. Nonetheless, the metal particles accumulated in the gap cause short circuit in the two conductive wires having the relatively small pitch.

SUMMARY OF THE INVENTION

The present application is directed to a composite circuit substrate structure with lower probability of causing short circuit in the patterned circuit of the composite circuit substrate structure by permeating or electron mobility.

A composite circuit substrate structure of the present application includes a first dielectric layer, a second dielectric layer, a glass fiber structure, and a patterned circuit. The first dielectric layer has a first surface and a second surface opposite to each other. The second dielectric layer is disposed on the first dielectric layer and entirely connected to the first surface. The glass fiber structure is distributed in the second dielectric layer. The patterned circuit is embedded in the first dielectric layer from the second surface, and the patterned circuit is not contacted with the glass fiber structure.

According to an embodiment of the present invention, a material of the first dielectric layer is resin.

According to an embodiment of the present invention, a material of the second dielectric layer is resin.

According to an embodiment of the present invention, the glass fiber structure is glass fiber cloth.

According to an embodiment of the present invention, the first dielectric layer has a patterned concave located on the second surface.

According to an embodiment of the present invention, the patterned circuit is accommodated in the patterned concave.

According to an embodiment of the present invention, a depth of the patterned concave is greater than a thickness of the patterned circuit.

According to an embodiment of the present invention, the second dielectric layer is laminated onto the first dielectric layer.

According to an embodiment of the present invention, the first dielectric layer includes a plurality of catalyst particles.

Based on the above, the patterned circuit in the composite circuit substrate structure of the application does not contact with the glass fiber structure in the dielectric layer, so as to reduce the probability of causing short circuit by permeating or electron mobility.

In order to make the aforementioned and other features and advantages of the present invention more comprehensible, several embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1:
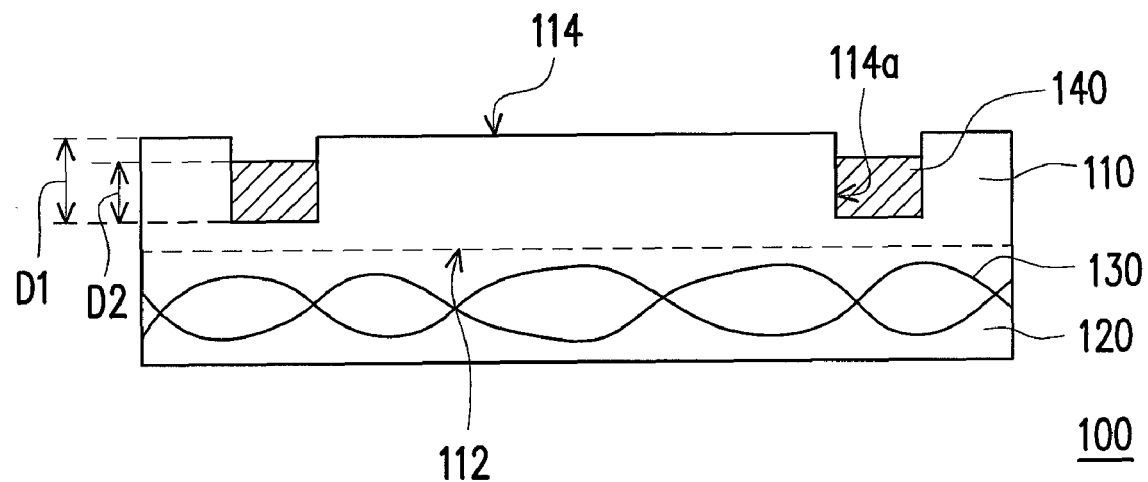
FIG. 1 is a cross-section view of a composite circuit substrate structure according to an embodiment of the present invention.

FIG. 1 is a cross-section view of a composite circuit substrate structure according to an embodiment of the present invention. Referring to FIG. 1, the composite circuit substrate structure 100 of the present embodiment includes a first dielectric layer 110, a second dielectric layer 120, a glass fiber structure 130, and a patterned circuit 140.

The first dielectric layer 110 has a first surface 112 and a second surface 114 opposite to each other. The second dielectric layer 120 is disposed on the first dielectric layer 110 and entirely connected to the first surface 112. The glass fiber structure 130 is distributed in the second dielectric layer 120. The patterned circuit 140 is embedded in the first dielectric layer 110 from the second surface 114, and the patterned circuit 140 is not contacted with the glass fiber structure 130. When conductive metal is formed in a gap between the second dielectric layer 120 and the glass fiber structure 130 due to permeating or electron mobility, short circuit of the patterned circuit 140 caused by contacting the conductive metal can be prevented.

As shown in FIG. 1, in the present embodiment, the first dielectric layer 110 has a patterned concave 114a located on the second surface 114, and the patterned circuit 140 is deposited in the patterned concave 114a.

To better elaborate the composite circuit substrate structure 100 of the present embodiment, a manufacturing process of the composite circuit substrate structure 100 of the present embodiment is described hereafter with reference to FIGS. 2A to 2D.

Figure 2A:
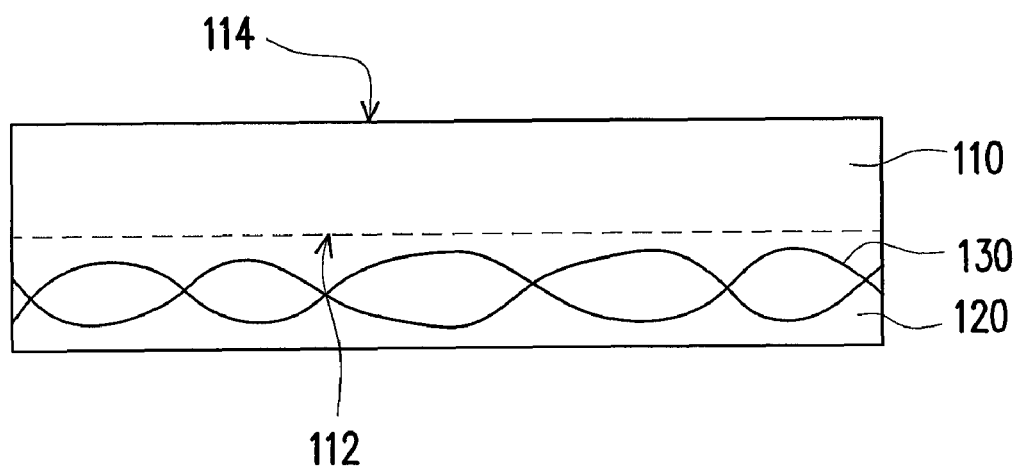
FIGS. 2A to 2D are flowcharts illustrating fabrication of the composite circuit substrate structure depicted in FIG. 1.

FIGS. 2A to 2D are flowcharts illustrating fabrication of the composite circuit substrate structure depicted in FIG. 1. As shown in FIG. 2A, a second dielectric layer 120 is provided at first. Here, a glass fiber structure 130 is distributed in the second dielectric layer 120. Next, the second dielectric layer 120 is laminated onto a first surface 112 of a first dielectric layer 110. In the present embodiment, the first dielectric layer 110 and the second dielectric layer 120 are made of resin, for example. The glass fiber structure 130 is, for example, glass fiber cloth.

A method of distributing the glass fiber structure 130 in the second dielectric layer 120 includes dipping glass fiber cloth in liquid resin and taking out the dipped glass fiber cloth from the resin. Resin is adhered to the glass fiber cloth taken out of the resin. After the resin is cured, a dielectric layer in which the glass fiber is distributed can be obtained.

Figure 2B:
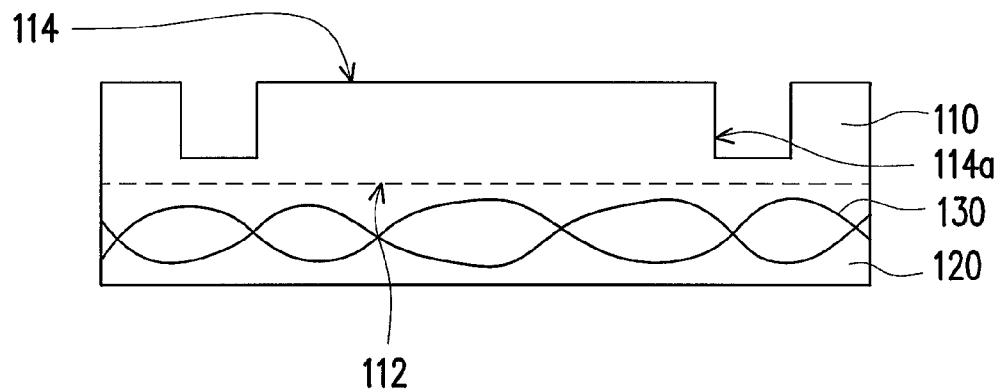
Figure 2C:
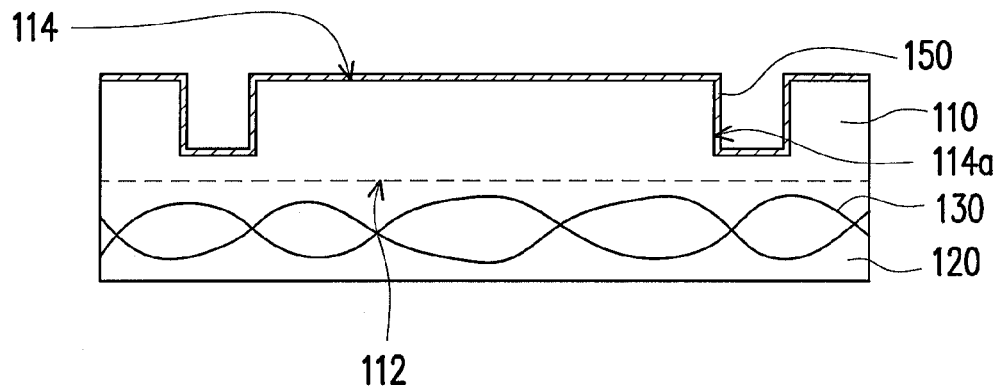

Referring to FIG. 2B, a patterned concave 114a is formed on a second surface 114 of the first dielectric layer 110 by laser ablation. Next, as indicated in FIG. 2C, an electroplating seed layer 150 is formed on the second surface 114 and the patterned concave 114a by chemical electroplating, which is conducive to implementation of a subsequent electroplating process. Thereafter, referring to FIG. 2D, a metal layer 160 is formed on the electroplating seed layer 150 by performing an electroplating process, and a portion of the metal layer 160 is removed by etching, so as to form the composite circuit substrate structure 100 illustrated in FIG. 1.

Figure 2D:
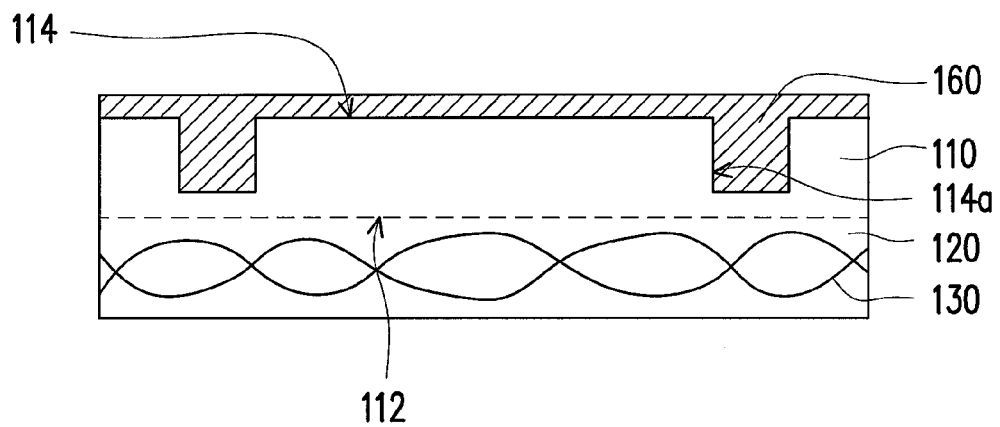

Referring to FIGS. 1 and 2D, the etching process is performed to remove the portion of the metal layer 160 on the second surface 114, so as to obtain the patterned circuit 140. However, a portion of the metal layer 160 located in the patterned concave 114a and adjacent to the second surface 114 is also likely to be removed during implementation of the etching process. Therefore, a depth D1 of the patterned concave 114a is greater than a thickness D2 of the patterned circuit 140.

Note that the patterned concave 114a is disposed in the first dielectric layer 110 without being extended to the second dielectric layer 120, and thus the patterned circuit 140 located in the patterned concave 114a does not contact with the glass fiber structure 130.

According to another embodiment that is not shown in the drawings, the first dielectric layer 110 can have a plurality of catalyst particles distributed therein. During formation of the patterned concave 114a by using laser, the catalyst particles located on a surface of the patterned concave 114a are activated. Hence, in comparison with the above embodiment, the embodiment not shown in the drawings teaches formation of the patterned circuit 140 in the patterned concave 114a by chemical electroplating in no need of forming the electroplating seed layer 150 on the second surface 114 and the patterned concave 114a.

Moreover, in still another embodiment that is not shown in the drawings, resin coated copper (RCC) can be employed to replace the first dielectric layer 110 depicted in FIG. 2A, and then the composite circuit substrate structure illustrated in FIG. 1 can be formed by applying a manufacturing method similar to the above. The RCC includes a dielectric layer and a metal layer disposed thereon. The metal layer is, for example, copper foil, such that the dielectric layer can be equipped with a relatively leveled surface.

In light of the foregoing, the patterned circuit in the composite circuit substrate structure of the application does not contact with the glass fiber structure in the dielectric layer. When the conductive metal is formed in the gap between the dielectric layer and the glass fiber structure due to permeating or electron mobility, short circuit of the patterned circuit caused by contacting the conductive metal can be better prevented.

It will be apparent to those skilled in the art that various modifications and variations can be made to the structure of the present application without departing from the scope or spirit of the invention. In view of the foregoing, it is intended that the present application cover modifications and variations of this invention provided they fall within the scope of the following claims and their equivalents.

What is claimed is:

1. A composite circuit substrate structure, comprising:
    a first dielectric layer having a first surface and a second surface opposite to each other;
    a second dielectric layer disposed on the first dielectric layer and entirely connected to the first surface;
    a glass fiber structure distributed in the second dielectric layer; and
    a patterned circuit embedded in the first dielectric layer from the second surface, wherein the patterned circuit is not contacted with the glass fiber structure, the first dielectric layer has a patterned concave located on the second surface, the patterned circuit is deposited in the patterned concave, and a depth of the patterned concave is greater than a thickness of the patterned circuit.

2. The composite circuit substrate structure as claimed in claim 1, wherein a material of the first dielectric layer is resin.

3. The composite circuit substrate structure as claimed in claim 1, wherein a material of the second dielectric layer is resin.

4. The composite circuit substrate structure as claimed in claim 1, wherein the glass fiber structure is glass fiber cloth.

5. The composite circuit substrate structure as claimed in claim 1, wherein the second dielectric layer is laminated onto the first dielectric layer.

6. The composite circuit substrate structure as claimed in claim 1, wherein the first dielectric layer comprises a plurality of catalyst particles.

* * * * *